(12) United States Patent
Nakamura et al.

(10) Patent No.: US 9,685,377 B2
(45) Date of Patent: *Jun. 20, 2017

(54) WAFER PROCESSING METHOD (71) Applicant: DISCO CORPORATION, Tokyo (JP)

(72) Inventors: Masaru Nakamura, Tokyo (JP); Yuya Matsuoka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/958,268

(22) Filed: Dec. 3, 2015

(65) Prior Publication Data

US 2016/0172312 A1 Jun. 16, 2016

(30) Foreign Application Priority Data

Dec. 15, 2014 (JP) ................................. 2014-253203

(51) Int. Cl.
*H01L 21/30* (2006.01)
*H01L 21/78* (2006.01)
*H01L 21/304* (2006.01)
*H01L 21/683* (2006.01)

(52) U.S. Cl.
CPC ............ *H01L 21/78* (2013.01); *H01L 21/304* (2013.01); *H01L 21/6836* (2013.01); *H01L 2221/6834* (2013.01); *H01L 2221/68327* (2013.01); *H01L 2221/68386* (2013.01); *H01L 2924/0002* (2013.01)

(58) Field of Classification Search
None
See application file for complete search history.

(56) References Cited

U.S. PATENT DOCUMENTS

| 9,269,624 | B2 * | 2/2016 | Nakamura | ............ H01L 21/268 |
| 2005/0106782 | A1 | 5/2005 | Genda et al. | |
| 2005/0272223 | A1 * | 12/2005 | Fujii | .................. B23K 26/0057 |
| | | | | 438/459 |

(Continued)

FOREIGN PATENT DOCUMENTS

| JP | 10-050642 | 2/1998 |
| JP | 2002-192370 | 7/2002 |

(Continued)

OTHER PUBLICATIONS

U.S. Appl. No. 15/179,063, filed Jun. 10, 2016.

*Primary Examiner* — Reema Patel
(74) *Attorney, Agent, or Firm* — Greer Burns & Crain Ltd.

(57) ABSTRACT

A wafer is divided into individual device chips along a plurality of scheduled division lines. A protective film is formed by coating liquid-state resin, which is hardened by irradiation of ultraviolet rays thereon, on the front face of the wafer. The protective film is hardened by irradiating ultraviolet rays upon the protective film. A protective tape is adhered on a front face of the hardened protective film. A modified layer is formed by irradiating a laser beam of a wavelength having a transparency to the wafer along the scheduled division lines with a focal point thereof positioned in the inside of the wafer. A back face of the wafer is ground while grinding water is supplied to thin the wafer to a given thickness and divide the wafer into the individual device chips along the scheduled division lines using the modified layer as a start point of the break.

11 Claims, 10 Drawing Sheets

(56) References Cited

U.S. PATENT DOCUMENTS

| | | | |
|---|---|---|---|
| 2006/0216911 | A1 | 9/2006 | Yoshikawa et al. |
| 2009/0042488 | A1* | 2/2009 | Sekiya .................. B24B 7/228 |
| | | | 451/41 |
| 2009/0091044 | A1 | 4/2009 | Seo et al. |
| 2009/0298263 | A1* | 12/2009 | Watanabe .......... B23K 26/0057 |
| | | | 438/463 |
| 2010/0129546 | A1 | 5/2010 | Kitahara et al. |
| 2011/0059620 | A1 | 3/2011 | Kitahara |
| 2012/0003816 | A1* | 1/2012 | Shimotani ............... H01L 21/78 |
| | | | 438/462 |
| 2013/0087947 | A1 | 4/2013 | Kitahara et al. |
| 2013/0330857 | A1 | 12/2013 | Sekiya |
| 2015/0104930 | A1 | 4/2015 | Aikawa et al. |

FOREIGN PATENT DOCUMENTS

| | | |
|---|---|---|
| JP | 2003-007648 | 1/2003 |
| JP | 2004-160493 | 6/2004 |
| JP | 2005-223282 | 8/2005 |
| JP | 2008-235650 | 10/2008 |
| JP | 2010-219461 | 9/2010 |
| JP | 2012-160515 | 8/2012 |
| JP | 2013-165229 | 8/2013 |

* cited by examiner

WAFER PROCESSING METHOD

BACKGROUND OF THE INVENTION

Field of the Invention

The present invention relates to a wafer processing method for dividing a wafer, which has a plurality of scheduled division lines formed in a grading on a front face thereof and has devices formed in a plurality of regions partitioned by the scheduled division lines, along the scheduled division lines.

Description of the Related Art

In a semiconductor device fabrication process, a plurality of regions are partitioned by scheduled division lines arrayed in a grating on a front face of a semiconductor wafer of a substantially disk shape, and devices such as ICs or LSIs are formed in the partitioned regions. By cutting the semiconductor wafer formed in this manner along the scheduled division lines, the regions in which the devices are formed are separated from each other to fabricate individual device chips.

The cutting of the semiconductor wafer along the scheduled division lines is normally carried out by a cutting apparatus called a dicing saw. The cutting apparatus includes a chuck table for holding a workpiece such as a semiconductor wafer or an optical device wafer thereon, cutting means for cutting the workpiece held on the chuck table, and cutting feeding means for moving the chuck table and the cutting means relative to each other. The cutting means includes a spindle unit which in turn includes a spindle, a cutting blade mounted on the spindle and a motor for driving the spindle to rotate. The cutting blade has a disk-shaped base and an annular cutting edge mounted on an outer periphery of the side face of the base. The cutting edge is fixed to the base by electrocasting of diamond abrasive grain of a particle size of, for example, approximately 3 µm and is formed with a thickness of approximately 20 µm.

However, since the cutting blade has a thickness of approximately 20 µm, it is necessary for the scheduled division lines for partitioning the devices from each other to have a width of approximately 50 µm. Therefore, the cutting apparatus has a problem in that the area ratio of the scheduled division lines occupying in the area of the wafer is high and the productivity is low.

Meanwhile, as a method of dividing a wafer such as a semiconductor water, also a laser processing method called internal processing has been put into practical use in recent years in which a pulse laser beam of a wavelength having a transparency to the wafer is used and irradiated with a focal point thereof positioned in the inside of a region in which the wafer is to be cut. A division method which uses the laser processing method called internal processing is a technology of irradiating a pulse laser beam of a wavelength having a transparency to a wafer from one face side of the wafer with a focal point thereof positioned in the inside of the wafer to continuously form a modified layer along a scheduled division line in the inside of the wafer and applying external force to the wafer along the scheduled division line along which the strength has dropped by the formation of the modified layer to break and divide the wafer (refer to, for example, Japanese Patent Laid-Open No. 2004-160493).

As a method of applying external force along a scheduled division line of a wafer along which a modified layer is formed to divide the wafer into individual device chips, a technology is disclosed in Japanese Patent Laid-Open No. 2005-223282. According to the technology, a wafer having a modified layer along scheduled division lines is adhered to a dicing tape mounted on an annular frame, and the dicing tape is expanded to apply tensile force to the wafer to divide the wafer so as to separate individual device chips from each other along the scheduled division lines along which the modified layer is formed and the strength is dropped thereby.

Another technology is disclosed in Japanese Patent Laid-Open No. 2013-165229. According to the technology, a protective tape is adhered to a front face of a wafer in which a modified layer is formed continuously along scheduled division lines and the wafer is held at the protective tape side thereof on a chuck table. Thereafter, the wafer is ground on the back face side thereof while grinding water is supplied thereto to form the wafer so as to have a predetermined thickness and the wafer is divided into individual device chips.

SUMMARY OF THE INVENTION

However, where a protective tape is adhered to the front face of a wafer in which a modified layer is formed continuously along scheduled division lines and the wafer is held at the protective tape side thereof on a chuck table and is ground on the back face thereof while grinding water is supplied thereto to form the wafer so as to have a predetermined thickness and the wafer is divided into individual device chips, there is a problem that the grinding water penetrates from between the gaps between the divided individual device chips and contaminates the side face and the front face of the device chips, by which the quality of the device chips is degraded.

Further, where an adhesive film is mounted on the back face of a wafer having been divided into individual device chips and a dicing tape is adhered and then is expanded to cut the adhesive film along the individual device chips, then since the adhesive film is formed a little greater than the wafer, an outer peripheral portion of the adhesive film is crushed and scattered. Therefore, there is a problem that the scattered adhesive film sticks to the front face of the device chips and degrades the quality of the device chips.

Therefore, it is an object of the present invention to provide a wafer processing method by which, when a protective tape is adhered to a front face of a wafer in which a modified layer is formed along scheduled division lines and the wafer is held at the protective tape side thereof on a chuck table to be ground on the back face thereof while grinding water is supplied to have a predetermined thickness and is divided into individual device chips, the dividing operation can be carried out without contaminating the side face and the front face of the device chips.

In accordance with an aspect of the present invention, there is provided a wafer processing method wherein a wafer having a plurality of scheduled division lines formed in a grating on a front face thereof and having a device formed in each of regions thereof partitioned by the scheduled division lines is divided along the scheduled division lines into individual device chips, the wafer processing method including a protective film forming step of coating liquid-state resin, which is hardened by irradiation of ultraviolet rays thereon, on the front face of the wafer to form a protective film, a protective film hardening step of irradiating ultraviolet rays upon the protective film to harden the protective film, a protective tape adhering step of adhering a protective tape on a front face of the protective film, a modified layer forming step of irradiating a laser beam of a wavelength having a transparency to the wafer along the scheduled division lines with a focal point thereof positioned in the inside of the wafer to form a modified layer along the scheduled division lines in the inside of the wafer, and a back face grinding step of grinding, after the protective tape adhering step and the modified layer forming step are carried out, a back face of the wafer while grinding water is supplied to thin the wafer to a given thickness and divide the wafer into the individual device chips along the scheduled division lines using the modified layer as a start point of the break.

Preferably, the wafer processing method further includes an adhesive film breaking step of adhering, after the back face grinding step is carried out, an adhesive film to the back face of the wafer divided into the individual device chips, adhering a dicing tape to the adhesive film, peeling off the protective tape from the front face of the wafer and expanding the dicing tape to break the adhesive film along the individual device chips, and a protective film removing step of supplying cleaning solution to a front face of the individual device chips after the adhesive film breaking step is carried out to remove the protective film.

Preferably, the liquid-state resin is formed from water-soluble resin, and the protective film removing step is carried out by supplying cleaning water to remove the protective film.

According to the wafer processing method of the present invention, although grinding water in which grinding dust is mixed penetrates from the gaps between the divided individual device chips in the back face grinding step, since the protective film is formed on the front face of the wafer, the grinding water does not come to the front face of the wafer. Accordingly, the problem that grinding water in which grinding dust is mixed contaminates the device chips and degrades the quality of the device chips is eliminated. Further, since the protective film coated on the front face of the wafer has been hardened by irradiation of ultraviolet rays, movement of the wafer during grinding is suppressed. Further, even if the wafer is divided into individual device chips, since expansion of the gaps is suppressed by the protective film coated comparatively firmly on the front face of the wafer, penetration of grinding water is prevented and side face contamination of the device chips can be reduced.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
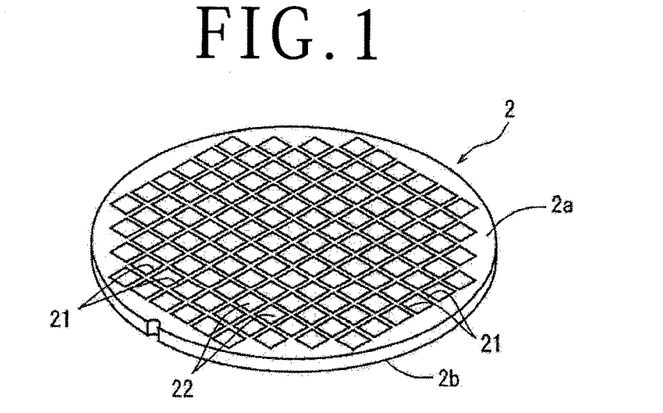
FIG. 1 is a perspective view of a semiconductor wafer.

In the following, a preferred embodiment of a wafer processing method according to the present invention is described in detail with reference to the accompanying drawings. FIG. 1 depicts a perspective view of a semiconductor wafer processed in accordance with the present invention. The semiconductor wafer 2 depicted in FIG. 1 is formed from a silicon wafer of a thickness, for example, of 500 μm. The semiconductor wafer 2 has a plurality of scheduled division lines 21 formed in a grating on a front face 2a thereof and has devices 22 such as ICs or LSIs formed in a plurality of regions partitioned by the scheduled division lines 21. In the following, a wafer processing method of dividing the semiconductor wafer 2 into the individual devices 22 along the scheduled division lines 21 is described.

Figure 2A:
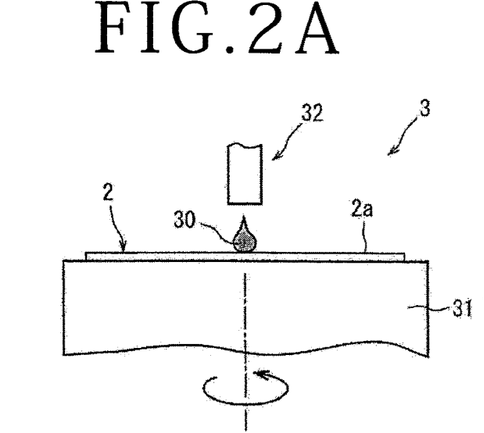
FIGS. 2A to 2C are schematic views illustrating a protective film forming step.
Figure 2B:
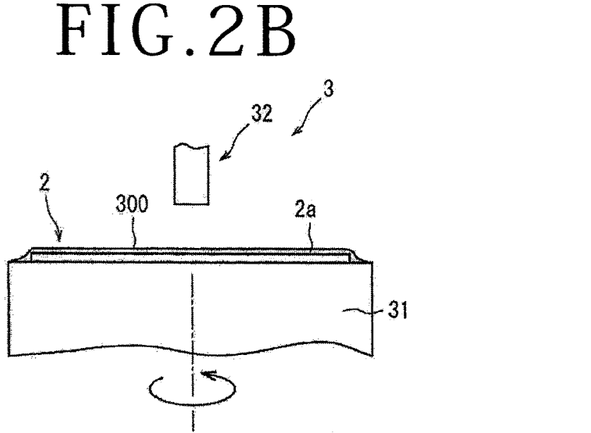
Figure 2C:
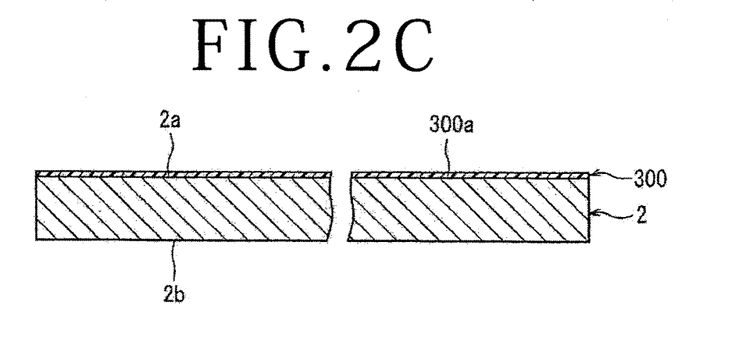

First, a protective film forming step of coating a liquid-state resin, which is hardened by irradiating ultraviolet rays thereon, to the front face 2a of the semiconductor wafer 2 to form a protective film is carried out. The protective film forming step is carried out using a protective film forming apparatus 3 depicted in FIGS. 2A and 2B. The protective film forming apparatus 3 includes a spinner table 31 for holding a wafer thereon and a resin liquid supplying nozzle 32 disposed above the center of rotation of the spinner table 31. The semiconductor wafer 2 is placed at the back face 2b side thereof on the spinner table 31 of the protective film forming apparatus 3 configured in this manner. Then, suction means not depicted is rendered operative to suck and hold the semiconductor wafer 2 to and on the spinner table 31. Accordingly, the semiconductor wafer 2 held on the spinner table 31 is laid with the front face 2a directed upwardly. After the semiconductor wafer 2 is held on the spinner table 31 in this manner, while the spinner table 31 is rotated at a predetermined rotational speed (for example, at 300 to 1000 rpm) in a direction indicated by an arrow mark as depicted in FIG. 2B, a predetermined amount of liquid-state resin 30 is dropped to a central region of the front face 2a of the semiconductor wafer 2 from the resin liquid supplying nozzle 32 disposed above the spinner table 31. Then, the spinner table 31 is rotated for approximately 60 seconds to form a protective film 300 on the front face 2a of the semiconductor wafer 2 as depicted in FIG. 2C. Although the thickness of the protective film 300 to be coated on the front face 2a of the semiconductor wafer 2 depends upon the dropping amount of the liquid-state resin 30, it may be approximately 50 μm. It is to be noted that, as the liquid-state resin 30 which is hardened by irradiation of ultraviolet rays, preferably water-soluble resin such as polyvinyl alcohol (PVA), water-soluble phenol resin or acrylic-based water-soluble resin is used.

Figure 3:
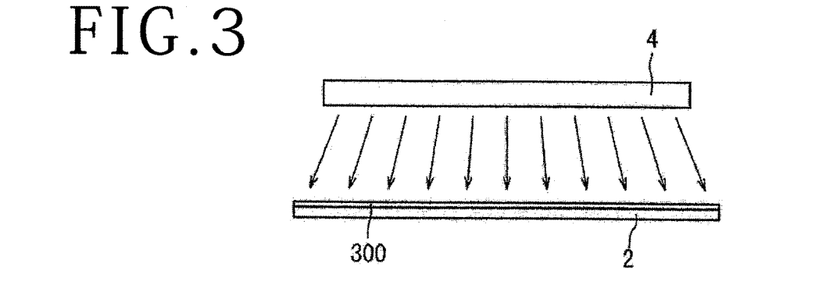
FIG. 3 is a schematic view depicting a protective film hardening step.

After the protective film forming step described above is carried out, a protective film hardening step for irradiating ultraviolet rays on the protective film 300 coated on the front face 2a of the semiconductor wafer 2 to harden the protective film 300 is carried out. In particular, as depicted in FIG. 3, ultraviolet rays are irradiated on the protective film 300 coated on the front face 2a of the semiconductor wafer 2 from an ultraviolet rays irradiator 4. As a result, the protective film 300 formed from liquid-state resin which is hardened by irradiation of ultraviolet rays is hardened.

Figure 4A:
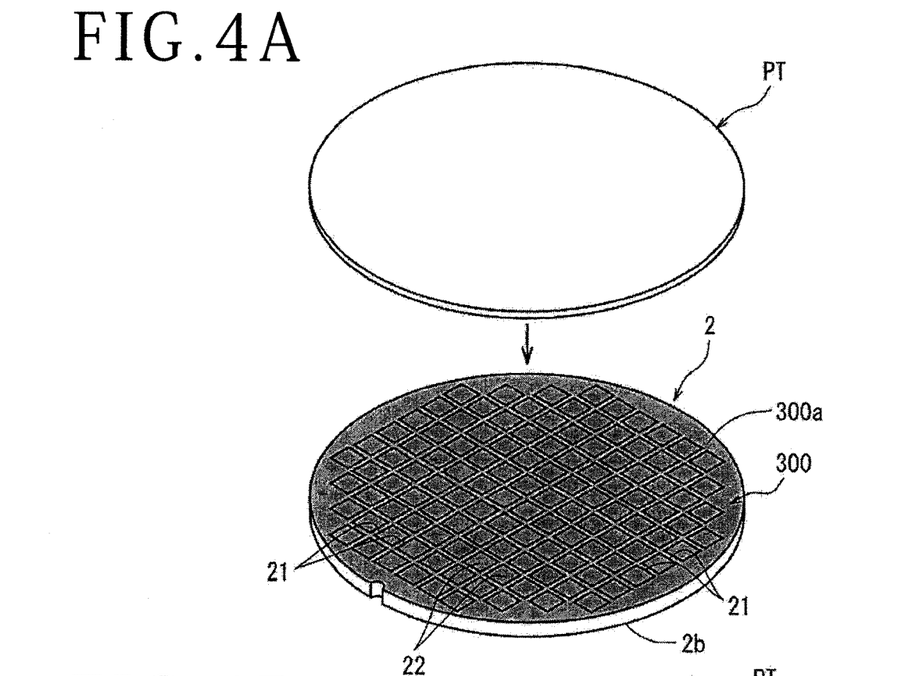
FIGS. 4A and 4B are schematic views depicting a protective tape adhering step.
Figure 4B:
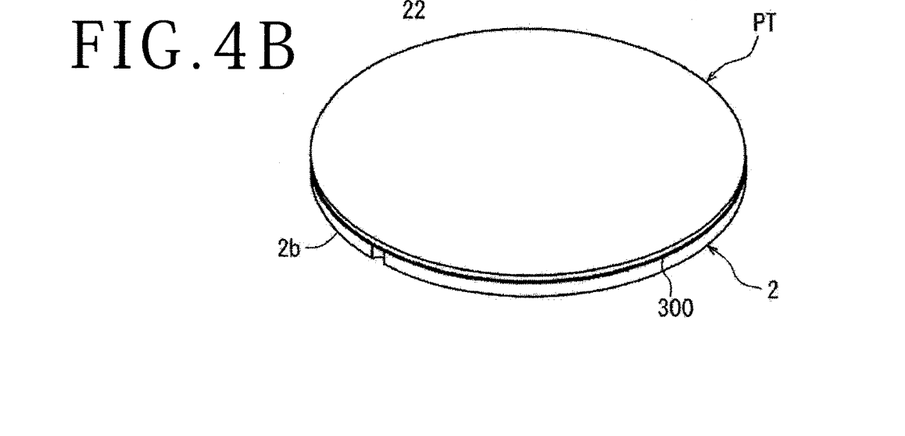

Thereafter, a protective tape adhering step for adhering a protective tape to a front face 300a of the protective film 300 hardened by carrying out the protective film hardening step is carried out. In particular, a protective tape PT is adhered to the front face 300a of the protective film 300 coated on the front face 2a of the semiconductor wafer 2 as depicted in FIGS. 4A and 4B. It is to be noted that the protective tape PT is configured such that, in the present embodiment, acrylic resin-based paste is applied to approximately 5 μm to the surface of a sheet-like base made of polyvinylchloride and having a thickness of 100 μm. It is to be noted that the protective film forming step and the protective tape adhering step described above are carried out before a back face grinding step hereinafter described is carried out.

Thereafter, a modified layer forming step for irradiating a laser beam of a wavelength having a transparency to the semiconductor wafer 2 along a scheduled division line 21 with a focal point thereof positioned in the inside of the semiconductor wafer 2 to form a modified layer along the scheduled division line 21 in the inside of the semiconductor wafer 2 is carried out. The modified layer forming step is carried out using a laser processing apparatus 5 depicted in FIG. 5. The laser processing apparatus 5 depicted in FIG. 5 includes a chuck table 51 for holding a workpiece thereon, laser beam irradiation means 52 for irradiating a laser beam upon the workpiece held on the chuck table 51, and image pickup means 53 for picking up an image of the workpiece held on the chuck table 51. The chuck table 51 is configured so as to suck and hold a workpiece thereto and thereon and is moved in a processing feeding direction indicated by an arrow mark X and an indexing feeding direction indicated by another arrow mark Y in FIG. 5 by a moving mechanism not depicted.

Figure 5:
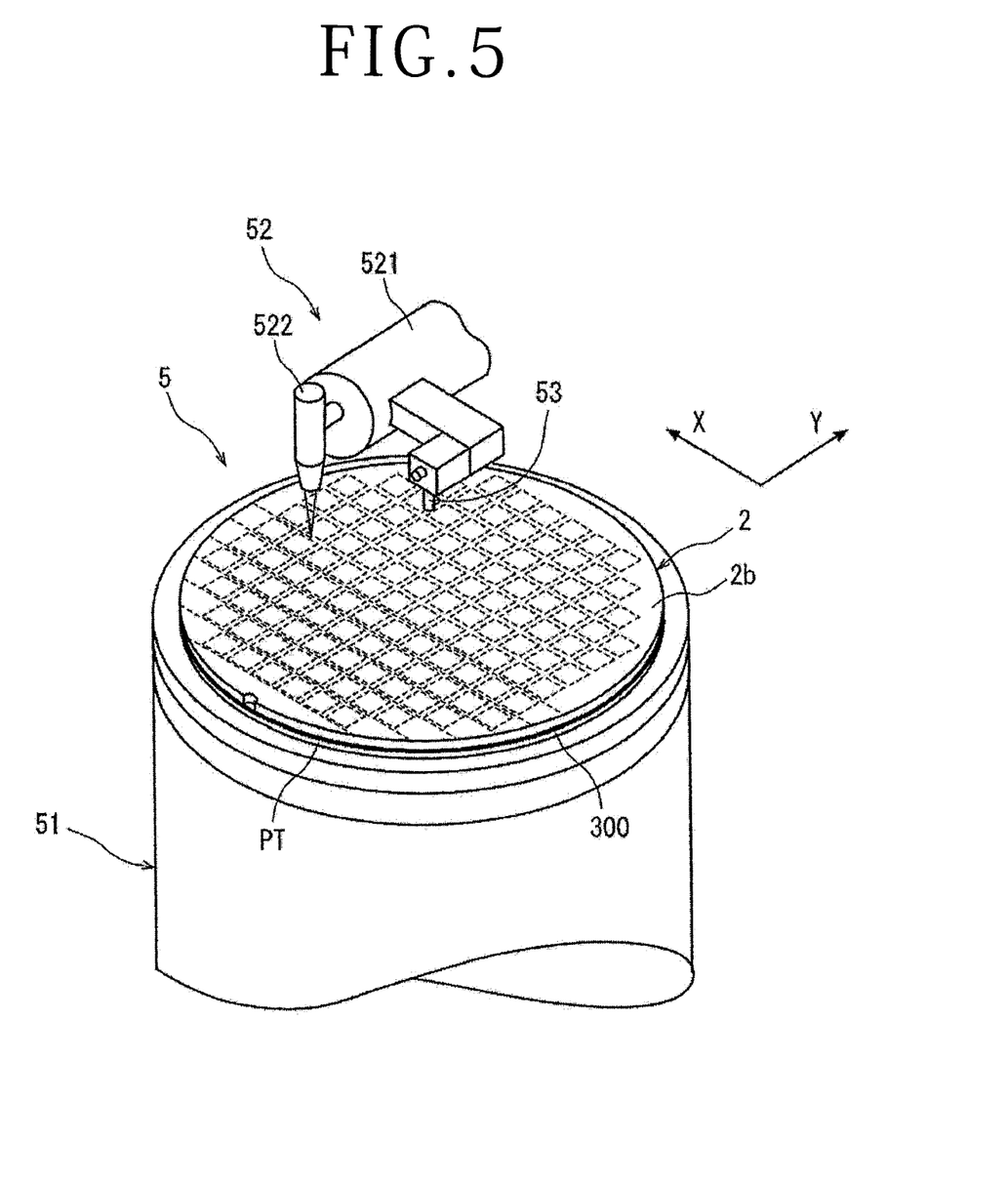
FIG. 5 is a partial perspective view of a laser processing apparatus for carrying out a modified layer forming step.

The laser beam irradiation means 52 irradiates a pulse laser beam from a condenser 522 mounted at a tip end of a casing 521 of a cylindrical shape disposed substantially horizontally. Further, the image pickup means 53 mounted at a tip end portion of the casing 521 which configures the laser beam irradiation means 52 is configured from an ordinary image pickup element such as a CCD for picking up an image using, in the present embodiment, visible rays. The image pickup means 53 is configured further from infrared illumination means for irradiating infrared rays on a workpiece, an optical system for capturing the infrared rays irradiated by the infrared illumination means, an infrared image pickup element for outputting an electric signal corresponding to the infrared rays captured by the optical system, and so forth. The image pickup means 53 sends a picked up image signal to control means not depicted.

The modified layer forming step carried out using the laser processing apparatus 5 described above is described with reference to FIGS. 5, 6A and 6B. At the modified layer forming step, the semiconductor wafer 2 after the protective tape adhering step is carried out therefor is first placed at the protective tape PT side thereof on the chuck table 51 of the laser processing apparatus 5 depicted in FIG. 5. Then, the semiconductor wafer 2 is sucked to and held on the chuck table 51 by the suction means not depicted with the protective tape PT interposed therebetween (wafer holding step). Accordingly, the semiconductor wafer 2 held on the chuck table 51 is laid with the back face 2b thereof positioned on the upper side. The chuck table 51 to and on which the semiconductor wafer 2 is sucked and held in this manner is positioned just below the image pickup means 53 by the processing feeding means not depicted.

After the chuck table 51 is positioned just below the image pickup means 53, an alignment work of detecting a processing region of the semiconductor wafer 2 to be laser-processed by the image pickup means 53 and the control means not depicted is carried out. In particular, the image pickup means 53 and the control means not depicted execute an image process such as pattern matching for carrying out positioning between a scheduled division line 21 formed in a first direction on the semiconductor wafer 2 and the condenser 522 of the laser beam irradiation means 52 which irradiates a laser beam along the scheduled division line 21 to carry out alignment of the laser beam irradiation position. Further, alignment of the laser beam irradiation position is carried out similarly also with a scheduled division line 21 formed on the semiconductor wafer 2 and extending in a direction perpendicular to the first direction. At this time, while the front face 2a of the semiconductor wafer 2 on which the scheduled division line 21 is formed is positioned on the lower side, since the image pickup means 53 includes image pickup means which is configured from infrared illumination means, an optical system for capturing the infrared rays and an infrared image pickup element which outputs an electric signal corresponding to the infrared rays as described hereinabove, an image of the scheduled division line 21 can be picked up from the back face 2b through the semiconductor wafer 2.

Figure 6A:
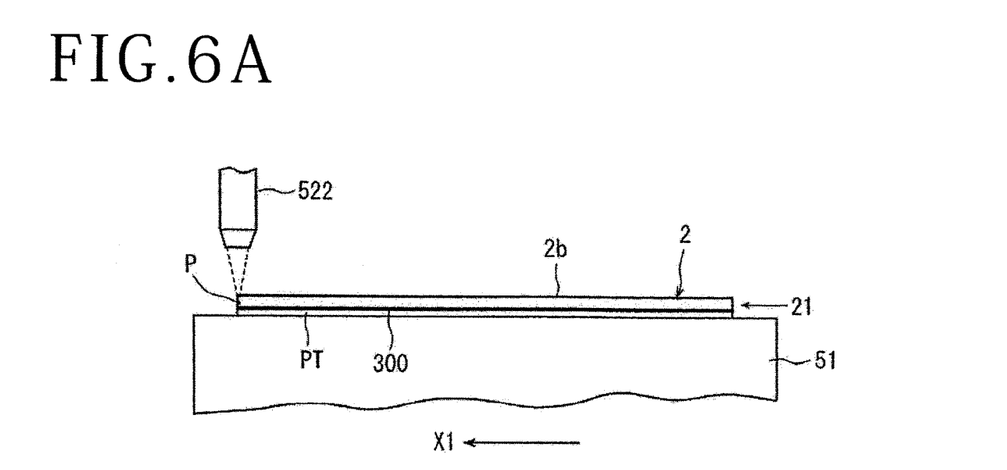
FIGS. 6A and 6B are schematic views depicting the modified layer forming step.
Figure 6B:
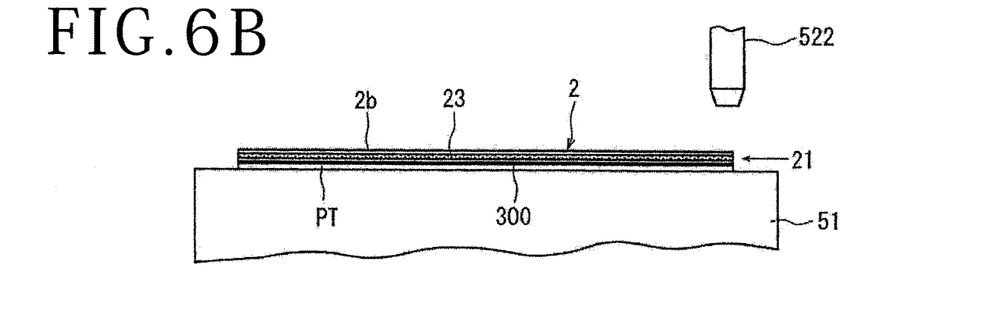

After a scheduled division line 21 formed on the semiconductor wafer 2 held on the chuck table 51 is detected and alignment of the laser beam irradiation position is carried out in such a manner as described above, the chuck table 51 is moved to a laser beam irradiation region in which the condenser 522 of the laser beam irradiation means 52 for irradiating a laser beam is positioned as depicted in FIG. 6A. Thereupon, the predetermined scheduled division line 21 is positioned at one end (left end in FIG. 6A) thereof just below the condenser 522 of the laser beam irradiation means 52. Thereafter, a focal point P of the pulse laser beam to be irradiated from the condenser 522 is positioned at an intermediate portion in the thicknesswise direction of the semiconductor wafer 2. Then, while a pulse laser beam of a wavelength having a transparency to a silicon wafer is irradiated from the condenser 522, the chuck table 51 is moved at a predetermined feeding speed in the direction indicated by an arrow mark X1 in FIG. 6A. Then, after the irradiation position of the condenser 522 of the laser beam irradiation means 52 comes to a position at the other end of the scheduled division line 21 as depicted in FIG. 6B, the irradiation of the pulse laser beam is stopped and the movement of the chuck table 51 is stopped. As a result, a modified layer 23 is formed along the scheduled division line 21 in the inside of the semiconductor wafer 2.

It is to be noted that the modified layer forming step is carried out, for example, in accordance with the following processing conditions.

Light source: YAG pulse laser
Wavelength: 1064 nm
Repetition frequency: 100 kHz
Average output power: 0.3 W
Focused spot diameter: 1 μm
Processing feeding speed: 100 mm/second After the modified layer forming step is carried out along the predetermined scheduled division line 21 as described above, the chuck table 51 is indexing-fed by a distance between the scheduled division lines 21 formed on the semiconductor wafer 2 in a direction indicated by an arrow mark Y (indexing feeding step), and the modified layer forming step described above is carried out. After the modified layer forming step is carried out along all of the scheduled division lines 21 formed in the first direction in this manner, the chuck table 51 is rotated by 90 degrees, and the modified layer forming step described above is carried out along the scheduled division lines 21 extending in the direction perpendicular to the scheduled division lines 21 formed in the first direction described above.

After the modified layer forming step is carried out, a back face grinding step of grinding the back face 2b of the semiconductor wafer 2 to a predetermined thickness while grinding water is supplied and dividing the semiconductor wafer 2 into individual device chips along the scheduled division lines 21 using the modified layer 23 as a start point of breaking is carried out. The back face grinding step is carried out using a grinding apparatus 6 depicted in FIG. 7A. The grinding apparatus 6 depicted in FIG. 7A includes a chuck table 61 for holding a workpiece thereon and grinding means 62 for grinding the workpiece held on the chuck table 61. The chuck table 61 is configured so as to suck and hold the workpiece to and on the upper face thereof and is rotated in a direction indicated by an arrow mark A in FIG. 7A by a rotational driving mechanism not depicted. The grinding means 62 includes a spindle housing 631, a spindle 632 supported for rotation on the spindle housing 631 and rotated by a rotational driving mechanism not depicted, a mounter 633 mounted at a lower end of the spindle 632, and a grinding wheel 634 attached to a lower face of the mounter 633. The grinding wheel 634 is configured from an annular base 635, and a plurality of grinding stones 636 mounted annularly on a lower face of the base 635. The base 635 is attached to a lower face of the mounter 633 by fastening bolts 637. It is to be noted that the spindle 632 configuring the grinding apparatus 6 described above has a grinding water supplying path provided thereon so as to extend along the axis thereof such that grinding water is supplied to the grinding region by the grinding stones 636 through the grinding water supplying path.

Figure 7A:
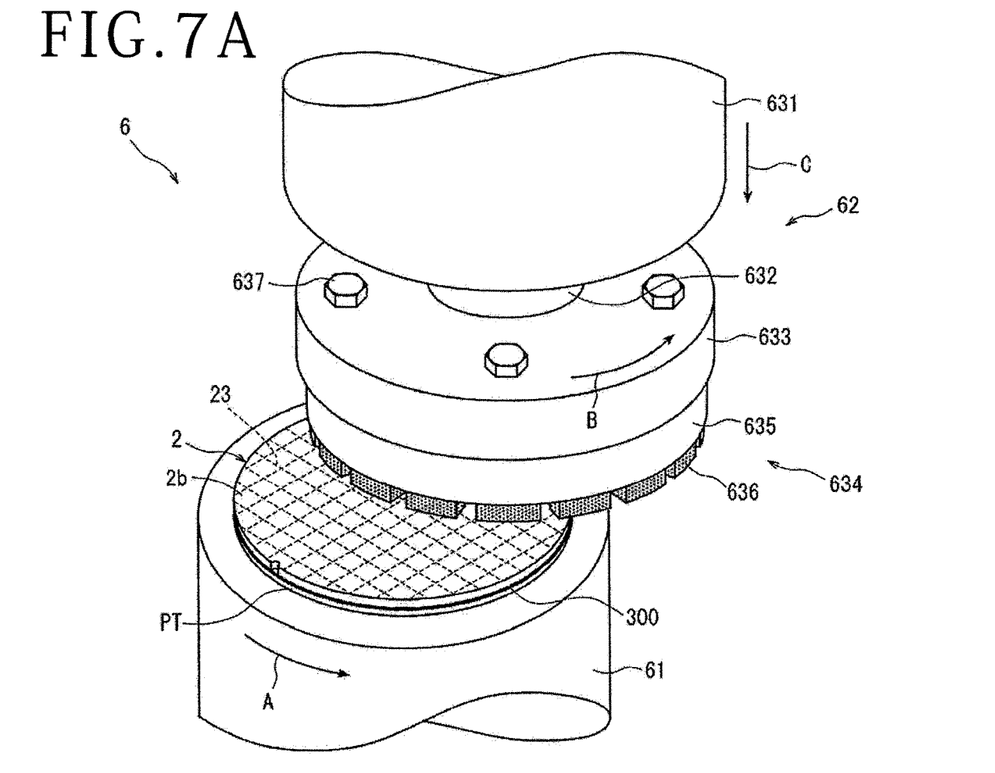
FIGS. 7A and 7B are schematic views depicting a back face grinding step.
Figure 7B:
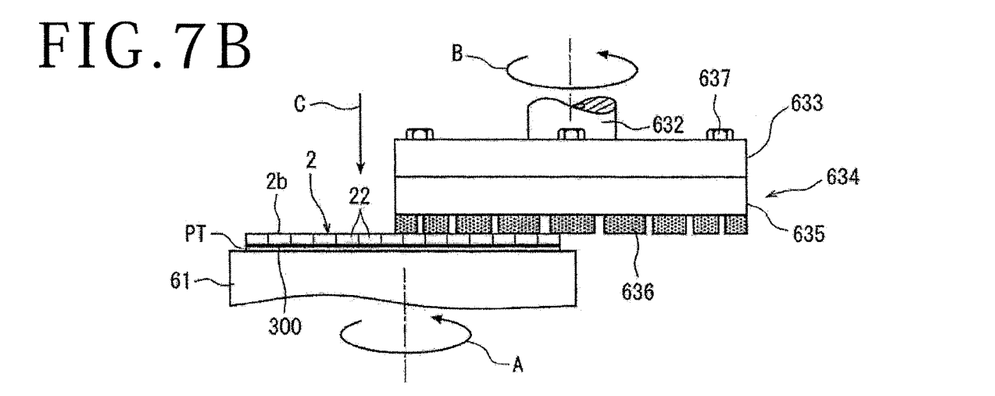

When the grinding apparatus 6 described above is used to carry out the back face grinding step, the semiconductor wafer 2 is placed at the protective tape PT side adhered to the front face 2a thereof on the upper face (holding face) of the chuck table 61 as depicted in FIG. 7A. Further, by the suction means not depicted, the semiconductor wafer 2 is sucked to and held on the chuck table 61 with the protective tape PT interposed therebetween (wafer holding step). Accordingly, the semiconductor wafer 2 held on the chuck table 61 is disposed such that the back face 2b thereof is positioned on the upper side. After the semiconductor wafer 2 is sucked to and held on the chuck table 61 with the protective tape PT interposed therebetween in this manner, while the chuck table 61 is rotated, for example, at 300 rpm in the direction indicated by the arrow mark A in FIG. 7A, the grinding wheel 634 of the grinding means 62 is rotated, for example, at 6000 rpm in a direction indicated by an arrow mark B in FIG. 7A and the grinding stones 636 are contacted with the back face 2b of the semiconductor wafer 2 of a workpiece as depicted in FIG. 7B. Then, the grinding wheel 634 is grinding-fed by a predetermined amount in a downward direction (in a perpendicular direction to the holding face of the chuck table 61) at a grinding feeding speed of, for example, 1 μm/second as indicated by an arrow mark C. In this manner, when the back face grinding step is carried out, grinding water is supplied to the grinding region by the grinding stones 636. As a result, the semiconductor wafer 2 is ground at the back face 2b thereof so as to be thinned to a predetermined thickness (for example, 100 μm) and is divided into individual device chips along the scheduled division lines 21 along which the modified layer 23 is formed and the strength is decreased thereby. It is to be noted that the plurality of device chips after the division are not spaced away from each other, but the form of the semiconductor wafer 2 is maintained because the protective tape PT is adhered to the front face of the device chips.

In the back face grinding step described above, since grinding water is supplied to the grinding region by the grinding stones 636, the grinding water in which grinding dust is mixed penetrates from the gaps between the divided individual device chips. However, since the protective film 300 is formed on the front face 2a of the semiconductor wafer 2, the grinding water does not come to the front face of the devices 22. Accordingly, the problem that grinding water in which grinding dust is mixed contaminates the devices 22 and degrades the quality of the device 22 is eliminated. Further, since the protective film 300 coated on the front face 2a of the semiconductor wafer 2 has been hardened by irradiation of ultraviolet rays, movement of the semiconductor wafer 2 during grinding is suppressed and cracking by contact between device chips does not occur. Further, even if the semiconductor wafer 2 is divided into individual device chips, since expansion of the gaps is suppressed by the protective film 300 coated comparatively firmly on the front face 2a of the semiconductor wafer 2, penetration of grinding water is prevented and side face contamination of the device chips can be reduced.

Figure 8A:
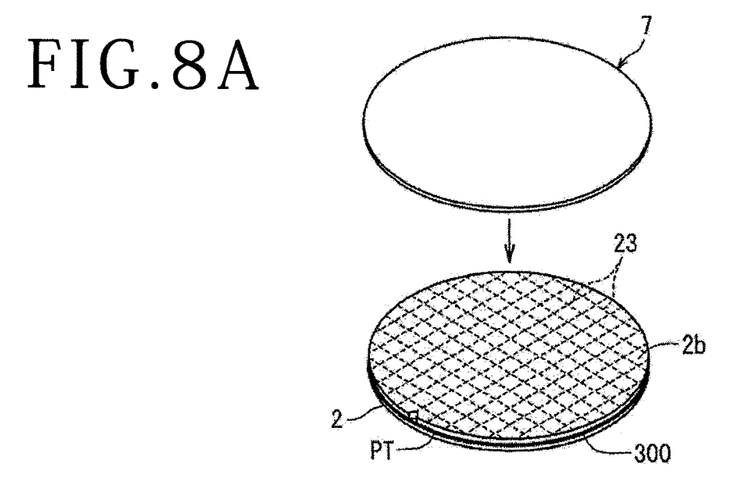
FIGS. 8A to 8C are schematic views depicting a first embodiment of a wafer supporting step.
Figure 8B:
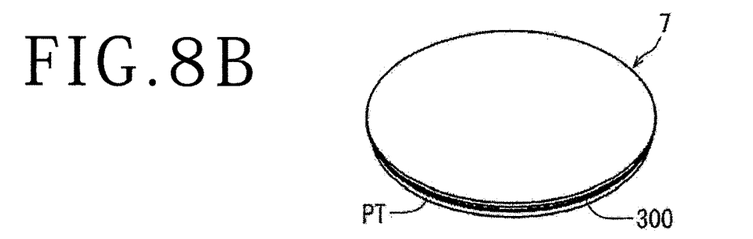
Figure 8C:
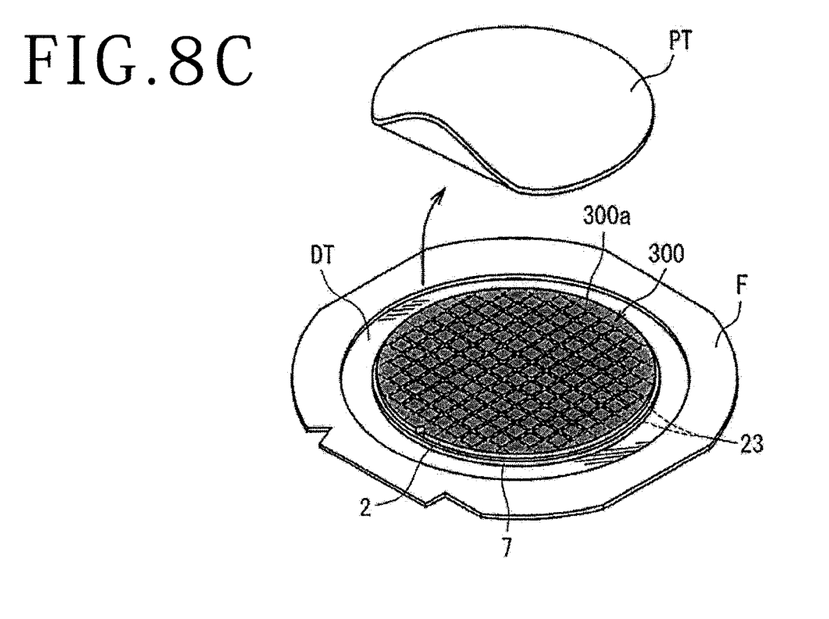

Thereafter, a wafer supporting step of mounting an adhesive film on the back face 2b of the semiconductor wafer 2 after the back face grinding step is carried out, adhering a dicing tape on the adhesive film side of the semiconductor wafer 2 and supporting an outer peripheral portion of the dicing tape by an annular frame is carried out. In an embodiment of the wafer supporting step, an adhesive film 7 is mounted on the back face 2b of the semiconductor wafer 2 as depicted in FIGS. 8A and 8B (adhesive film mounting step). It is to be noted that the adhesive film 7 is formed a little greater than the semiconductor wafer 2 in order that it may be adhered with certainty to the overall area of the back face 2b of the semiconductor wafer 2. After the adhesive film 7 is mounted on the back face 2b of the semiconductor wafer 2 in this manner, the semiconductor wafer 2 on which the adhesive film 7 is mounted is adhered at the adhesive film 7 side thereof to an extendible dicing tape DT mounted on an annular frame F as depicted in FIG. 8C. Then, the protective tape PT adhered to the front face 300a of the protective film 300 coated on the front face 2a of the semiconductor wafer 2 is peeled off (protective tape peeling off step). It is to be noted that, while the present embodiment demonstrates an example wherein the semiconductor wafer 2 on which the adhesive film 7 is mounted is adhered at the adhesive film 7 side thereof to the dicing tape DT mounted on the annular frame F, the dicing tape DT may be adhered to the adhesive film 7 side of the semiconductor wafer 2 on which the adhesive film 7 is mounted while the dicing tape DT is mounted at an outer peripheral portion thereof to the annular frame F simultaneously.

Figure 9A:
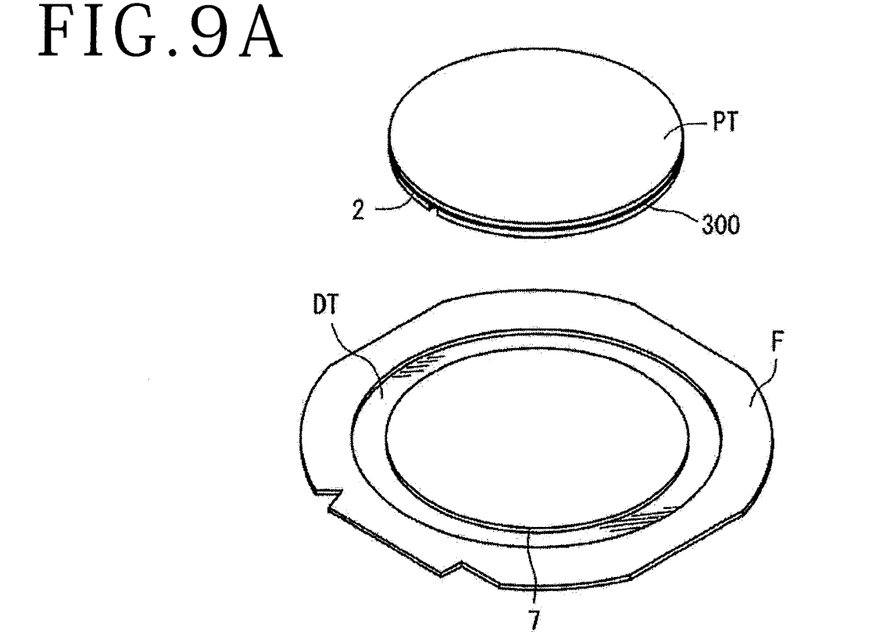
FIGS. 9A and 9B are schematic views depicting a second embodiment of the wafer supporting step.
Figure 9B:
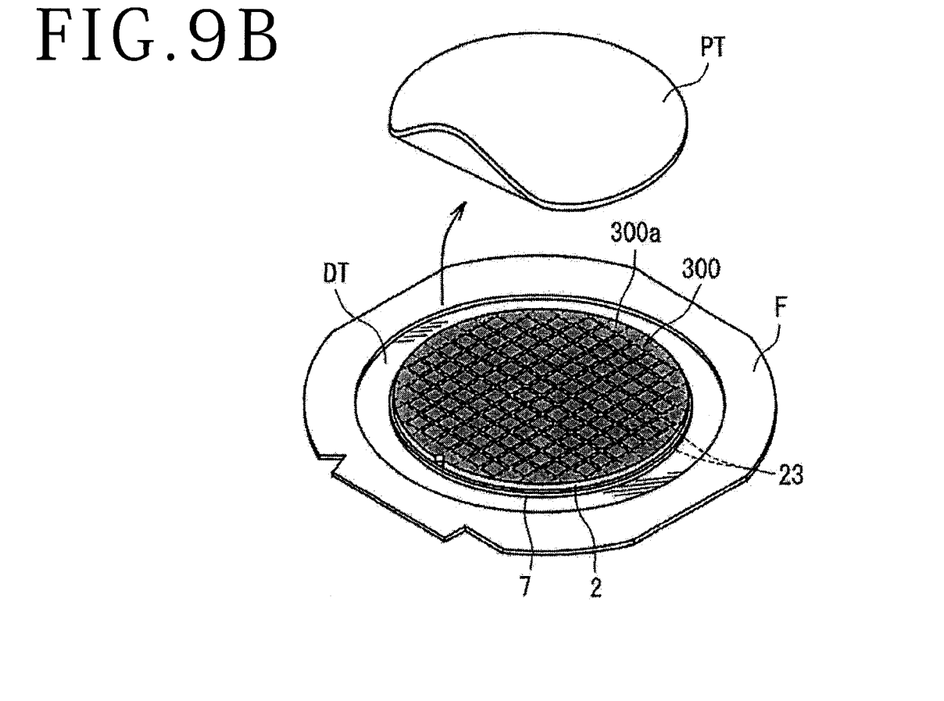

Another embodiment of the wafer supporting step described above is described with reference to FIGS. 9A and 9B. In the present embodiment, a dicing tape DT with an adhesive film wherein the adhesive film 7 is adhered to the front face of the dicing tape DT in advance is used. In particular, the semiconductor wafer 2 is mounted at the back face 2b thereof to the adhesive film 7 adhered to the front face of the dicing tape DT mounted at an outer peripheral portion thereof so as to cover an inner side opening of the annular frame F as depicted in FIGS. 9A and 9B. Where a dicing tape with a reinforcing sheet is used in this manner, by mounting the semiconductor wafer 2 at the back face 2*b* thereof to the adhesive film 7 adhered to the front face of the dicing tape DT, the semiconductor wafer 2 on which the adhesive film 7 is mounted is supported by the dicing tape DT mounted on the annular frame F. It is to be noted that also the adhesive film 7 adhered in advance to the front face of the dicing tape DT is formed a little greater than the semiconductor wafer 2 in order to mount the adhesive film 7 with certainty over the overall area of the back face 2*b* of the semiconductor wafer 2. Then, the protective tape PT adhered to the front face 300*a* of the protective film 300 coated on the front face 2*a* of the semiconductor wafer 2 is peeled off as depicted in FIG. 9B (protective tape peeling off step). It is to be noted that, while the present embodiment demonstrates an example in which the semiconductor wafer 2 is mounted at the back face 2*b* thereof on the adhesive film 7 adhered to the front face of the dicing tape DT mounted at an outer peripheral portion thereof on the annular frame F, the adhesive film 7 adhered to the dicing tape DT may be mounted on the back face 2*b* of the semiconductor wafer 2 while the dicing tape DT is mounted at an outer peripheral portion thereof on the annular frame F simultaneously.

Figure 10:
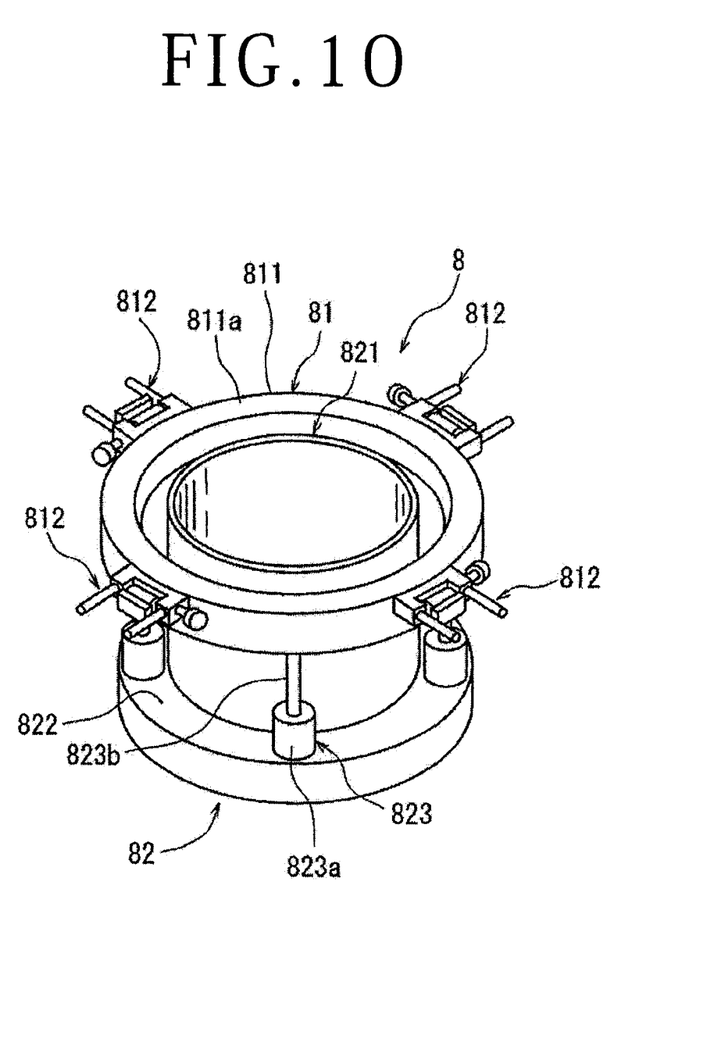
FIG. 10 is a perspective view of a tape expansion apparatus.

After the wafer supporting step is carried out in such a manner as described above, an adhesive film breaking step of expanding the dicing tape DT to break the adhesive film 7 along the individual device chips is carried out. The adhesive film breaking step is carried out using a tape expansion apparatus 8 depicted in FIG. 10. The tape expansion apparatus 8 depicted in FIG. 10 includes frame holding means 81 for holding the annular frame F thereon, and tape expansion means 82 for expanding the dicing tape DT mounted on the annular frame F held by the frame holding means 81. The frame holding means 81 is configured from an annular frame holding member 811, and a plurality of clamps 812 as fixing means disposed on an outer periphery of the frame holding member 811. An upper face of the frame holding member 811 forms a receiving face 811*a* on which the annular frame F is to be placed, and the annular frame F is placed on the receiving face 811*a*. Further, the annular frame F placed on the receiving face 811*a* is fixed to the frame holding member 811 by the clamps 812. The frame holding means 81 configured in this manner is supported for back and forth movement in upward and downward directions by the tape expansion means 82.

Figure 11A:
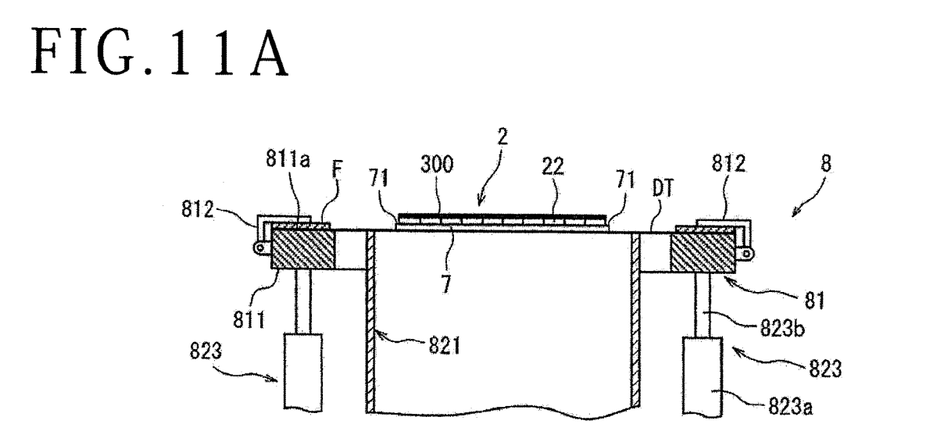
FIGS. 11A and 11B are schematic views depicting an adhesive film breaking step.
Figure 11B:
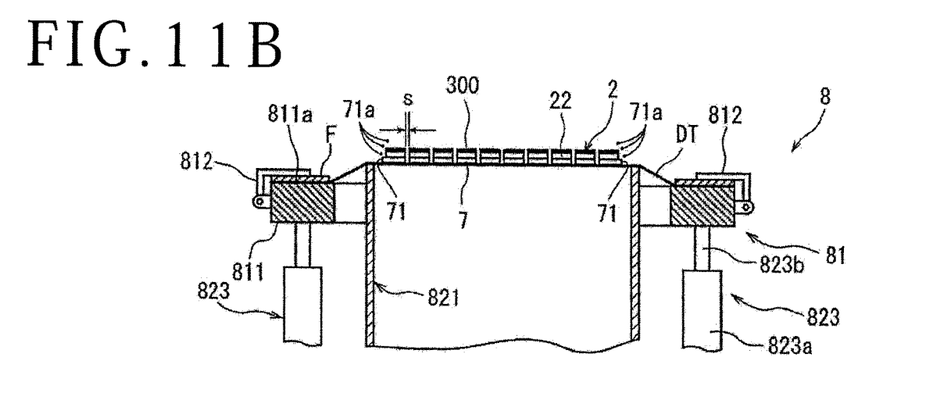

The tape expansion means 82 includes an expansion drum 821 disposed on the inner side of the annular frame holding member 811. This expansion drum 821 has an inner diameter and an outer diameter smaller than the inner diameter of the annular frame F but greater than the outer diameter of the semiconductor wafer 2 adhered to the dicing tape DT mounted on the annular frame F. Further, the expansion drum 821 includes a supporting flange 822 at a lower end thereof. The tape expansion means 82 includes supporting means 823 for supporting the annular frame holding member 811 for back and forth movement in the upward and downward directions. The supporting means 823 is configured from a plurality of air cylinders 823*a* disposed on the supporting flange 822, and a piston rod 823*b* of each of the air cylinders 823*a* is connected to a lower face of the annular frame holding member 811. The supporting means 823 configured from the plurality of air cylinders 823*a* in this manner moves the annular frame holding member 811 in the upward and downward directions between a reference position at which the receiving face 811*a* has a height substantially same as that of an upper end of the expansion drum 821 as depicted in FIG. 11A and an expansion position lower by a predetermined distance from the upper end of the expansion drum 821 as depicted in FIG. 11B.

The adhesive film breaking step carried out using the tape expansion apparatus 8 configured in such a manner as described above is described below with reference to FIGS. 11A and 11B. In particular, the annular frame F on which the dicing tape DT to which the semiconductor wafer 2 is adhered is mounted is placed on the receiving face 811*a* of the frame holding member 811 configuring the frame holding means 81 as depicted in FIG. 11A and is fixed to the frame holding member 811 by the clamps 812 (frame holding step). At this time, the frame holding member 811 is positioned at the reference position depicted in FIG. 11A. Then, the plurality of air cylinders 823*a* as the supporting means 823 configuring the tape expansion means 82 are rendered operative to move the annular frame holding member 811 downwardly to the expansion position depicted in FIG. 11B. Accordingly, since also the annular frame F fixed to the receiving face 811*a* of the frame holding member 811 moves downwardly, the dicing tape DT mounted on the annular frame F is brought into contact with and expanded by an upper end edge of the expansion drum 821 (tape expanding step). Accordingly, the semiconductor wafer 2 (divided along the scheduled division lines 21) adhered to the dicing tape DT with the adhesive film 7 interposed therebetween has gaps (s) formed between the device chips.

As a result, the adhesive film 7 adhered to the back face 2*b* of the semiconductor wafer 2 is broken and separated along the device chips. When the adhesive film 7 is broken along the device chips in this manner, a portion 71*a* of an outer periphery 71 of the adhesive film 7 which protrudes from the outer peripheral edge of the semiconductor wafer 2 is crushed and scattered and drops to the front face side of the devices 22. However, since the protective film 300 is coated on the front face of the devices 22, the portion 71*a* of the crushed outer periphery 71 sticks to the front face 300*a* of the protective film 300 coated on the front face of the devices 22 and does not directly stick to the front face of the devices 22. Accordingly, by removing the protective film 300 coated on the front face of the devices 22, also the portion 71*a* of the outer periphery 71 of the sticking adhesive film 7 is removed, and consequently, the quality of the device chips is not degraded.

Figure 12A:
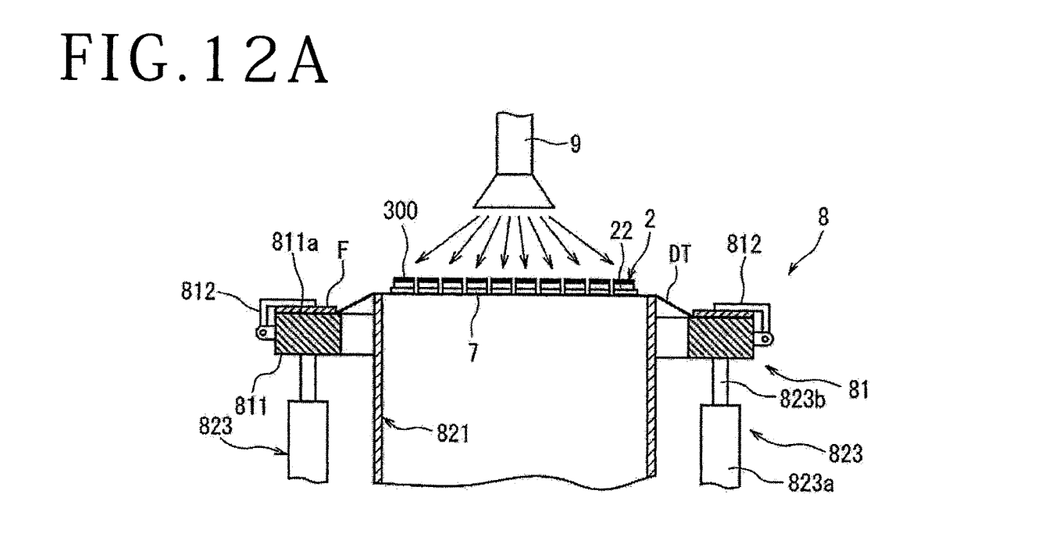
FIGS. 12A and 12B are schematic views depicting a protective film removing step.
Figure 12B:
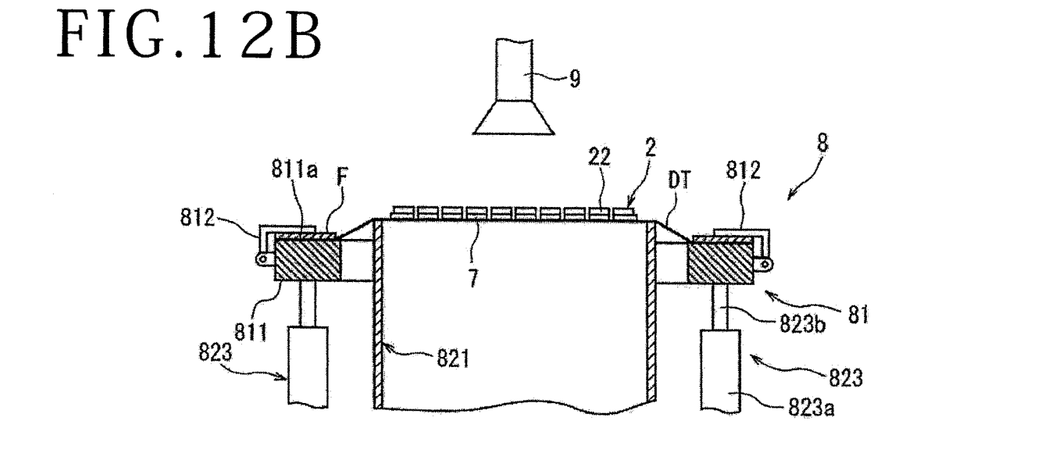

After the adhesive film breaking step described above is carried out, a protective film removing step of supplying cleaning solution to the front face of the individual device chips to remove the protective film 300 is carried out. The protective film removing step is carried out in the following manner. In particular, the tape expansion apparatus 8 is positioned just below a cleaning water supplying nozzle 9 as depicted in FIG. 12A from the state depicted in FIG. 11B after the adhesive film breaking step is carried out. Then, cleaning water as cleaning solution is supplied from the cleaning water supplying nozzle 9 to the front face 300*a* of the protective film 300 coated on the front face of the individual devices 22 adhered to the dicing tape DT mounted on the annular frame F. As a result, as depicted in FIG. 12B, since the protective film 300 is configured from water-soluble resin, it is removed readily by the cleaning water and also part of the adhesive film 7 sticking to the front face 300*a* of the protective film 300 is removed. Accordingly, since part of the adhesive film 7 does not stick to the front face of the devices 22, the quality of the device chips is not degraded.

After the protective film removing step is carried out in such a manner as described above, the device chips having the adhesive film 7 mounted on the back face thereof are transported to a pickup step of peeling off the device chips from the dicing tape DT and picking up the device chips.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method wherein a wafer having a plurality of scheduled division lines formed in a grating on a front face thereof and having a device formed in each of regions thereof partitioned by the scheduled division lines is divided along the scheduled division lines into individual device chips, the wafer processing method comprising:
   a protective film forming step of coating liquid-state resin, which is hardened by irradiation of ultraviolet rays thereon, on the front face of the wafer, with the devices thereon, to form a protective film;
   a protective film hardening step of irradiating ultraviolet rays upon the protective film to harden the protective film;
   a protective tape adhering step of adhering a protective tape on a front face of the hardened protective film, wherein the protective tape adhering step is performed after the protective film hardening step;
   a modified layer forming step of irradiating a laser beam of a wavelength having a transparency to the wafer along the scheduled division lines with a focal point thereof positioned in the inside of the wafer to form a modified layer along the scheduled division lines in the inside of the wafer, wherein the modified layer forming step is performed after the protective tape adhering step; and
   a back face grinding step of grinding, after the protective tape adhering step and the modified layer forming step are carried out, a back face of the wafer while grinding water is supplied to thin the wafer to a given thickness and divide the wafer into the individual device chips along the scheduled division lines using the modified layer as a start point of the break.

2. The wafer processing method according to claim 1, further comprising:
   a step of adhering a dicing tape to the back face of the wafer; and
   a step of expanding the dicing tape to divide the wafer into the individual device chips, wherein the expanding step is performed with the hardened protective film on the front face of the wafer.

3. The wafer processing method according to claim 1, wherein the back face grinding step is performed while the hardened protective film and the protective tape are located on the wafer.

4. The wafer processing method according to claim 1, further comprising:
   a step of adhering a dicing tape to the back face of the wafer; and
   a step of expanding the dicing tape to divide the wafer into the individual device chips, wherein the expanding step is performed with the hardened protective film on the front face of the wafer, such that the protective film is broken and separated during the expanding step.

5. The wafer processing method according to claim 1, wherein the modified layer forming step is performed upon the wafer with the hardened protective film on the front face of the wafer and with the protective tape on the hardened protective film.

6. The wafer processing method according to claim 1, wherein the protective tape adhering step includes the use of a paste to adhere the protective tape to the hardened protective film.

7. The wafer processing method according to claim 6, wherein the paste comprises an acrylic resin-based paste.

8. The wafer processing method according to claim 6, wherein the protective tape comprises a sheet-like base and the paste is applied to the sheet-like base.

9. The wafer processing method according to claim 8, wherein the paste comprises an acrylic resin-based paste.

10. A wafer processing method wherein a wafer having a plurality of scheduled division lines formed in a grating on a front face thereof and having a device formed in each of regions thereof partitioned by the scheduled division lines is divided along the scheduled division lines into individual device chips, the wafer processing method comprising:
    a protective film forming step of coating liquid-state resin, which is hardened by irradiation of ultraviolet rays thereon, on the front face of the wafer to form a protective film;
    a protective film hardening step of irradiating ultraviolet rays upon the protective film to harden the protective film;
    a protective tape adhering step of adhering a protective tape on a front face of the protective film;
    a modified layer forming step of irradiating a laser beam of a wavelength having a transparency to the wafer along the scheduled division lines with a focal point thereof positioned in the inside of the wafer to form a modified layer along the scheduled division lines in the inside of the wafer;
    a back face grinding step of grinding, after the protective tape adhering step and the modified layer forming step are carried out, a back face of the wafer while grinding water is supplied to thin the wafer to a given thickness and divide the wafer into the individual device chips along the scheduled division lines using the modified layer as a start point of the break;
    an adhesive film breaking step of adhering, after the back face grinding step is carried out, an adhesive film to the back face of the wafer divided into the individual device chips, adhering a dicing tape to the adhesive film, peeling off the protective tape from the front face of the wafer and expanding the dicing tape to break the adhesive film along the individual device chips; and
    a protective film removing step of supplying cleaning solution to a front face of the individual device chips after the adhesive film breaking step is carried out to remove the protective film.

11. A wafer processing method wherein a wafer having a plurality of scheduled division lines formed in a grating on a front face thereof and having a device formed in each of regions thereof partitioned by the scheduled division lines is divided along the scheduled division lines into individual device chips, the wafer processing method comprising:
    a protective film forming step of coating liquid-state resin, which is hardened by irradiation of ultraviolet rays thereon, on the front face of the wafer to form a protective film;
    a protective film hardening step of irradiating ultraviolet rays upon the protective film to harden the protective film;
    a protective tape adhering step of adhering a protective tape on a front face of the protective film;
    a modified layer forming step of irradiating a laser beam of a wavelength having a transparency to the wafer along the scheduled division lines with a focal point thereof positioned in the inside of the wafer to form a modified layer along the scheduled division lines in the inside of the wafer; and a back face grinding step of grinding, after the protective tape adhering step and the modified layer forming step are carried out, a back face of the wafer while grinding water is supplied to thin the wafer to a given thickness and divide the wafer into the individual device chips along the scheduled division lines using the modified layer as a start point of the break, an adhesive film breaking step of adhering, after the back face grinding step is carried out, an adhesive film to the back face of the wafer divided into the individual device chips, adhering a dicing tape to the adhesive film, peeling off the protective tape from the front face of the wafer and expanding the dicing tape to break the adhesive film along the individual device chips; and a protective film removing step of supplying cleaning solution to a front face of the individual device chips after the adhesive film breaking step is carried out to remove the protective film, wherein the liquid-state resin is formed from water-soluble resin, and the protective film removing step is carried out by supplying cleaning water to remove the protective film.

\* \* \* \* \*